United States Patent
Cheng et al.

(10) Patent No.: US 10,269,864 B2
(45) Date of Patent: Apr. 23, 2019

(54) PIXEL ISOLATION DEVICE AND FABRICATION METHOD

(71) Applicant: Taiwan Semiconductor Manufacturing Company, Ltd., Hsinchu (TW)

(72) Inventors: Yu-Hung Cheng, Tainan (TW); Tung-I Lin, Tainan (TW); Wei-Li Chen, Tainan (TW); Yeur-Luen Tu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/888,907

(22) Filed: Feb. 5, 2018

(65) Prior Publication Data

US 2018/0158863 A1 Jun. 7, 2018

Related U.S. Application Data

(62) Division of application No. 14/967,046, filed on Dec. 11, 2015, now Pat. No. 9,887,235.

(51) Int. Cl.
*H01L 27/146* (2006.01)

(52) U.S. Cl.
CPC .............. *H01L 27/14689* (2013.01)

(58) Field of Classification Search
CPC .................................. H01L 27/1463
USPC ............................. 257/93; 438/57
See application file for complete search history.

(56) References Cited

U.S. PATENT DOCUMENTS

| | | | | |
|---|---|---|---|---|
| 5,424,544 A * | 6/1995 | Shelton | ...... | G01J 5/34 250/332 |
| 5,578,826 A * | 11/1996 | Walker | ...... | G01J 5/20 250/332 |
| 9,130,072 B1 * | 9/2015 | Chen | ...... | H01L 27/1464 |
| 2005/0184353 A1 * | 8/2005 | Mouli | ...... | H01L 27/1463 257/446 |
| 2013/0113061 A1 * | 5/2013 | Lai | ...... | H01L 27/1463 257/432 |
| 2013/0176396 A1 * | 7/2013 | Cohen | ...... | H01L 27/1461 348/46 |
| 2014/0035087 A1 * | 2/2014 | Liu | ...... | H01L 27/1463 257/443 |

(Continued)

OTHER PUBLICATIONS

Harame, D. et al., "E15~23—SiGe, Ge, and Related Compounds: Materials, Processing, and Devices 3", 214th ECS Meeting of the Electrochemical Society, Oct. 12-Oct. 17, 2008, 13 pages, Honolulu, HI, accessed Dec. 7, 2018. http://ma.ecsdl.org/content/MA2008-02/37#content-block.

*Primary Examiner* — Jami Valentine Miller
(74) *Attorney, Agent, or Firm* — Slater Matsil, LLP

(57) ABSTRACT

Backside illuminated (BSI) image sensor devices are described as having pixel isolation structures formed on a sacrificial substrate. A photolayer is epitaxially grown over the pixel isolation structures. Radiation-detecting regions are formed in the photolayer adjacent to the pixel isolation structures. The pixel isolation structures include a dielectric material. The radiation-detecting regions include photodiodes. A backside surface of the BSI image sensor device is produced by planarized removal of the sacrificial substrate to physically expose the pixel isolation structures or at least optically expose the photolayer.

20 Claims, 5 Drawing Sheets

(56) References Cited

U.S. PATENT DOCUMENTS

| | | | | |
|---|---|---|---|---|
| 2014/0138785 A1* | 5/2014 | Pralle | ................ | H01L 27/14627 |
| | | | | 257/432 |
| 2014/0183606 A1* | 7/2014 | Kakehi | ............. | H01L 27/14689 |
| | | | | 257/290 |
| 2014/0264719 A1* | 9/2014 | Chou | ................ | H01L 21/76229 |
| | | | | 257/506 |
| 2015/0090887 A1* | 4/2015 | Chappo | ............... | H01L 27/1463 |
| | | | | 250/362 |
| 2015/0349001 A1* | 12/2015 | Wang | ................. | H01L 27/1463 |
| | | | | 257/443 |

* cited by examiner

PIXEL ISOLATION DEVICE AND FABRICATION METHOD

This application is a divisional of and claims priority to U.S. patent application Ser. No. 14/967,046, filed on Dec. 11, 2015, and entitled, "Pixel Isolation Device and Fabrication Method," which application is incorporated herein in its entirety by reference.

BACKGROUND

Semiconductor image sensors are used for sensing light. Complementary metal-oxide-semiconductor (CMOS) image sensors and charge-coupled device (CCD) sensors are widely used in a variety of applications, including, e.g., webcams, digital video cameras, digital single-lens reflex (SLR) cameras, digital mirrorless cameras, digital mobile phone cameras, and/or the like. Such devices use an array of sensor picture elements (pixels) employing, e.g., photodiodes to absorb electromagnetic radiation and convert the absorbed radiation into electrical signals (photocurrent). A backside illuminated (BSI) image sensor is one such device.

With shrinking device feature size, conventional BSI image sensors may suffer from problems involving crosstalk (XT) and blooming. One form of XT occurs when a photon falling on a sensor pixel is falsely detected by a neighboring pixel. Blooming occurs when the electrical charge in a given sensor pixel exceeds a peak saturation level and leaks over to adjacent pixels. These problems may be caused or aggravated by poor isolation between adjacent pixels in an image sensor array.

BRIEF DESCRIPTION OF THE DRAWINGS

For a more complete understanding of the disclosed embodiments and the advantages thereof, reference is made to the following description taken in conjunction with the accompanying drawings, in which.

Corresponding numerals and symbols in the different figures generally refer to corresponding elements, unless otherwise indicated. The figures are drawn to representatively illustrate relevant aspects of disclosed embodiments and are not necessarily drawn to scale.

DETAILED DESCRIPTION

The making and using of disclosed embodiments are discussed in detail below. It should be appreciated, however, that the present specification provides many applicable inventive concepts that may be embodied in a variety of contexts. The specific embodiments discussed herein merely illustrate specific ways to make and use the disclosed subject matter, and do not limit the scope of various other embodiments.

Representative embodiments will be described with respect to a specific context; namely, backside illuminated (BSI) image sensor devices. Additional embodiments and contexts may be realized by application or extension of disclosed devices, structures, elements, features, methods, or processes to a variety of other image sensor or semiconductor devices, structures, elements, features, methods, or processes.

A conventional method for producing a BSI image sensor begins with providing a photolayer substrate in which photodiodes are subsequently formed by ion implantation. A gate oxide layer and transfer gate are formed on the substrate. A logic device and interconnect layer having one or more metallization layers are bonded to the photolayer substrate assembly across a passivation layer. An etching process is then engaged to form trench isolation recesses in the photolayer substrate material. Thereafter, dielectric material is deposited to fill the trench recesses. The filled trenches and exposed photolayer substrate are then covered with a metal oxide layer to form a backside surface of the BSI image sensor. Conventional approaches for manufacturing trench isolation devices generally involve removal of photolayer material to form isolation structures.

Etching processes used to form conventional trench isolation devices may result in defects in or on the surfaces of the trench recesses. These defects may include physical, chemical, and/or electrical flaws that trap electrons or holes. Trapped carriers can produce leakage current, which presents a substantial problem for image sensing devices. For example, with a sufficient amount of leakage current, radiation-sensing devices may falsely detect light, even when the image sensor is placed in an optically dark environment. Alternatively stated, the image sensor may "see" light where there is no light. Under such circumstances, the leakage current may be referred to as "dark current," and the pixel containing the affected radiation-sensing device may become what may be termed a "white pixel." Dark currents and white pixels are forms of electrical aberration that degrade the performance characteristics of image sensor devices with which they are associated.

Figure 1:
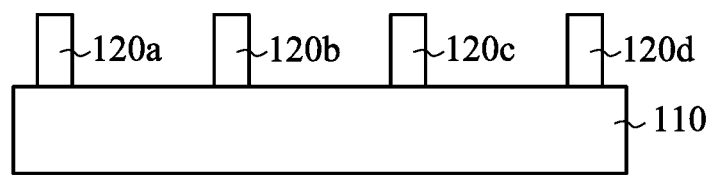
FIGS. 1-6 illustrate, in cross-sectional views, a method of forming a backside illuminated (BSI) image sensor device in accordance with a representative embodiment.

With reference to FIG. 1, a method in accordance with a representative embodiment of the disclosure begins with providing a sacrificial substrate (substrate 110) having a first side and a second side. Substrate 110 has an initial thickness that is in a range from about 100 μm to about 3000 μm. In one embodiment, substrate 110 may comprise a p-type dopant and have an initial thickness of about 770 μm.

A dielectric layer is deposited (FIG. 10, step 1010) on the first side of substrate 110 and patterned (FIG. 10, step 1020) to produce pixel isolation structures 120a, 120b, 120c, 120d. Dielectric material may be deposited on substrate 110 using CVD, physical vapor deposition (PVD), atomic layer deposition (ALD), and/or the like, or combinations thereof. In one embodiment, dielectric material may be deposited with plasma enhanced chemical vapor deposition (PECVD).

A hard mask material is deposited over the dielectric material. The hard mask material is lithographically patterned using a photoresist (e.g., deposited by spin-on coating) and various aligning, imaging, developing, rinsing, drying, baking, stripping, and/or etching processes, or combinations thereof, known in the art. Exposure and development transfers the pattern from the photoresist to the underlying hard mask layer. Thereafter, the dielectric layer may be etched and the hard mask material removed to produce pixel isolation structures 120a, 120b, 120c, 120d. In other embodiments, lithographic processing may be implemented or replaced with, e.g., maskless photolithography, electronbeam writing, ion-beam writing, or the like. Etching processes may include dry etching, wet etching, or a combination thereof.

The dielectric material of pixel isolation structures 120a, 120b, 120c, 120d may comprise, e.g., an oxide material, a nitride material, or an oxynitride material. In one embodiment, the dielectric material forming pixel isolation structures 120a, 120b, 120c, 120d may comprise $SiO_2$. In other representative embodiments, dielectric material forming pixel isolation structures 120a, 120b, 120c, 120d may alternatively or conjunctively comprise SiC, SiN, SiOC, SiON, and/or the like, or a combination thereof.

In accordance with various representative embodiments disclosed herein, methods for pixel isolation structure fabrication generally comprise an anteceding step of depositing a dielectric material and a subsequent step of patterning the deposited dielectric material to form the isolation structures. In various embodiments, pixel isolation structures 120a, 120b, 120c, 120d may comprise deep trench isolation (DTI) structures having depths ranging from about 1 µm to about 3 µm. In a representative embodiment, pixel isolation structures 120a, 120b, 120c, 120d may have a depth of about 1 µm.

Figure 2:
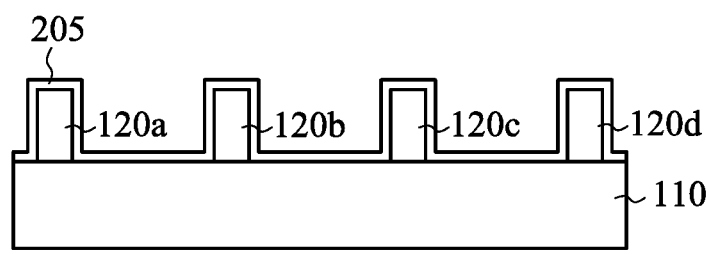

In accordance with one embodiment, as representatively illustrated in FIG. 2, pixel isolation structures 120a, 120b, 120c, 120d may be covered in a conformal manner with a dopant source material to produce dopant layer 205. A doped material, such as boron-doped polysilicon (Si:B), may be deposited with a low pressure chemical vapor deposition (LPCVD) process at a dosage of about $1E19$ ions/cm$^3$ to about $2E21$ ions/cm$^3$ over pixel isolation structures 120a, 102b, 102c, 120d. Deposition of Si:B covers the dielectric material of pixel isolation structures 120a, 120b, 120c, 120d to a depth of several nanometers. After deposition, the Si:B dopant layer may then be subjected to an in situ thermal diffusion process (e.g., baking at about 900° C. for about 10 minutes) to drive boron into the dielectric material to a depth of about 10 nm to about 60 nm (the "doping profile" or "region of doped dielectric material"). Boron prevents electron/hole recombination, and therefore serves as an effective passivation boundary between adjacent device elements. Skilled artisans will appreciate that other dopants, whether now known or hereafter derived, may be alternatively or conjunctively used for passivation of pixel isolation structures 120a, 120b, 120c, 120d.

After thermal diffusion, the doping profile 210a, 210b, 210c, 210d will have a substantially uniform dopant concentration. That is to say, in the case of the dopant layer 205 comprising Si:B, the concentration of boron measured for any portion or segment of the doping profile 210a, 210b, 210c, 210d will not vary substantially from that of any other portion or segment.

Electrical aberrations in the form of dark currents and white pixels may be caused at least in part by isolation structure surface defects. These defects may be eliminated or otherwise substantially reduced with suitably adapted dopant layer 205 deposition and processing in accordance with various representative embodiments. Skilled artisans will appreciate that other doping processes (e.g., ALD, plasma diffusion, and/or the like, or combinations thereof) may be alternatively, conjunctively, or sequentially employed to form dopant layer 205.

In various representative embodiments disclosed herein, the dopant layer, doping profile, and patterned dielectric material may be in various permutations and at various stages of fabrication referred to as "pixel isolation structures." For example, prior to thermal diffusion of dopant from the dopant layer 205 into the dielectric material of pixel isolation structures 120a, 120b, 120c, 120d, a "pixel isolation structure" may be understood as comprising an interiorly-disposed region corresponding to lithographically patterned dielectric material and an exteriorly-disposed region corresponding to the dopant layer 205. After thermal diffusion of dopant into the dielectric material of pixel isolation structures 120a, 102b, 120c, 120d, a "pixel isolation structure" may be understood as comprising an interiorly-disposed region corresponding to lithographically patterned dielectric material and an exteriorly-disposed region corresponding to the doped dielectric material of the doping profile 210a, 210b, 210c, 210d.

Figure 3:
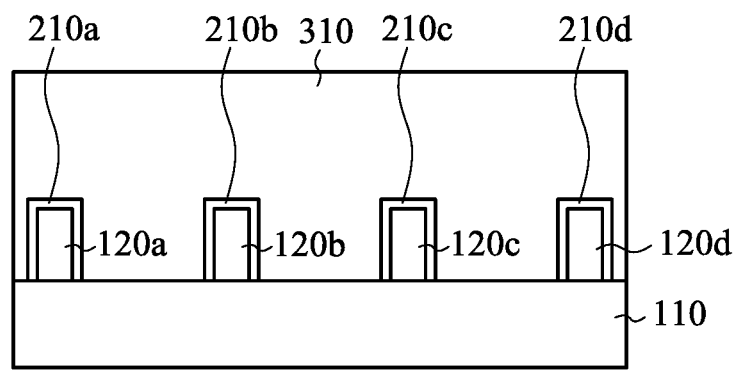
Figure 10:
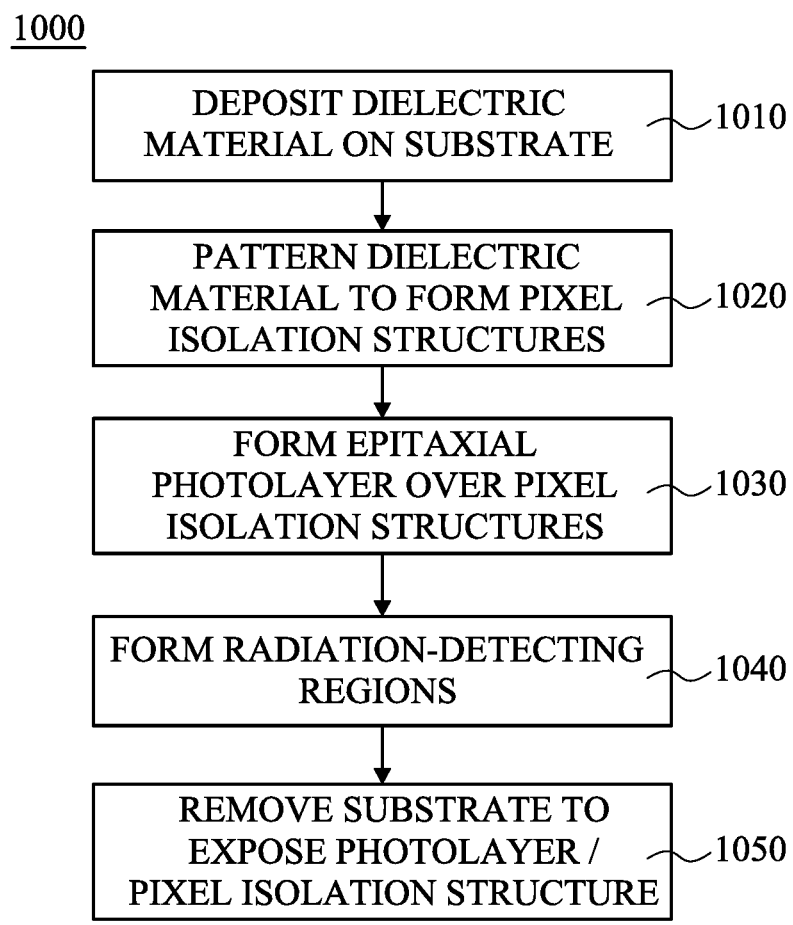
FIG. 10 is a flowchart illustrating a method (1000) of forming a BSI image sensor device in accordance with a representative embodiment.

As representatively illustrated in FIG. 3, photolayer 310 may be deposited over pixel isolation structures 120a, 120b, 120c, 120d using an in situ epitaxial growth process (FIG. 10, step 1030). In one embodiment, photolayer 310 may comprise epitaxial silicon or silicon-germanium, e.g., doped with boron, phosphorus, or carbon. In a representative embodiment, photolayer 310 may comprise one or more n-type epitaxial silicon or silicon-germanium layers. Photolayer 310 may alternatively or conjunctively comprise one or more p-type epitaxial silicon or silicon-germanium layers. In an exemplary embodiment, photolayer 310 comprises multiple layers of n-type epitaxial silicon. In a representative implementation, the epitaxial growth process may comprise, e.g., a selective epitaxial growth (SEG) process.

In a representative embodiment, passivation of pixel isolation structures 120a, 120b, 120c, 120d with dopant layer 205 may be suitably adapted to permit epitaxial growth of photolayer 310 to proceed in a manner that does not produce, or otherwise substantially reduces, defects (e.g., crystallographic dislocations) at the doping profile 210a, 210b, 210c, 210d/photolayer 310 interface. Accordingly, the doping profile 210a, 210b, 210c, 210d/photolayer 310 interface may be regarded as substantially defect free.

In a representative embodiment, an SEG process may be performed to epitaxially form photolayer 310. The SEG process may comprise, e.g., a CVD process, such as LPCVD. In a representative embodiment, LPCVD may be performed at temperatures between about 300° C. to about 1050° C. and pressures between about 1 Torr to about 500 Torr. The LPCVD process may use a silicon-based or germanium-based precursor gas, such as, e.g., silane, dichlorosilane, disilane, trisilane, other silicon-based gases, germane, or other germanium-based precursor gases, or a combination thereof. Other process gases may include, e.g., diborane, molecular hydrogen, molecular chlorine, and/or the like, or combinations thereof. As the LPCVD process proceeds, dopant layer 205 is removed leaving behind doped dielectric material of the doping profile 210a, 210b, 210c, 210d.

In representative embodiments not employing dopant layer 205, an etching gas (e.g., $SiH_2Cl_2$, HCl, or the like) may be used to control selective growth between silicon areas and dielectric surfaces of pixel isolation structures 120a, 120b, 120c, 120d. In other embodiments, deposition and etching processes may be separately performed or otherwise separately controlled. For example, an epitaxial deposition process may be performed for non-selective growth of silicon followed by etching steps to remove deposited silicon from a dielectric surface to maintain selectivity.

The SEG process may be adapted to provide in situ doping concurrent with epitaxial deposition of photolayer 310. In a representative embodiment, an n-type dopant may be introduced using a phosphorus-containing gas, such as, e.g., phosphine ($PH_3$). Accordingly, the epitaxial layer(s) forming photolayer 310 may comprise silicon doped with phosphorus (Si:P). In one embodiment, the silicon-based precursor gas may be introduced into a chamber at a flow rate of about 50 standard cubic centimeters per minute (sccm) to about 500 sccm, and phosphine (e.g., 1 atom %) may be introduced into the chamber at a flow rate of about 0.01 sccm to about 100 sccm. The deposition time of SEG Si:P may be from about 60 seconds to about 1200 seconds. If epitaxially formed photolayer 310 is not doped during SEG processing, it may be doped in a subsequent process that uses, e.g., ion implantation, plasma immersion ion implantation (PIII), gas/solid source diffusion, or other process(es), or a combination thereof. An annealing process (e.g., rapid thermal anneal, laser thermal anneal, etc.) may be performed to activate dopants in photolayer 310. SEG processes are known in the art and it will be understood that various parameters may be modified or otherwise tuned to epitaxially form photolayer 310 (e.g., temperature, pressure, deposition time, and/or the like).

In various representative embodiments, epitaxially deposited material of photolayer 310 may be selected for compatibility with subsequent implantation of a depletion zone suitably configured for the detection of electromagnetic radiation of a given wavelength. For example, the band gap of silicon is 1.1 eV. This corresponds to a near infrared threshold wavelength of about 1100 nm. Other materials may be alternatively selected to provide different threshold detection wavelengths. For example, photolayer 310 may comprise any of: Ge, SC, SiGe, GaAs, GaP, InP, InAs, InSb, GaAsP, AlInAs, AlGaAs, GaInAs, GaInP, GaInAsP, and/or the like, or combinations thereof.

Figure 4:
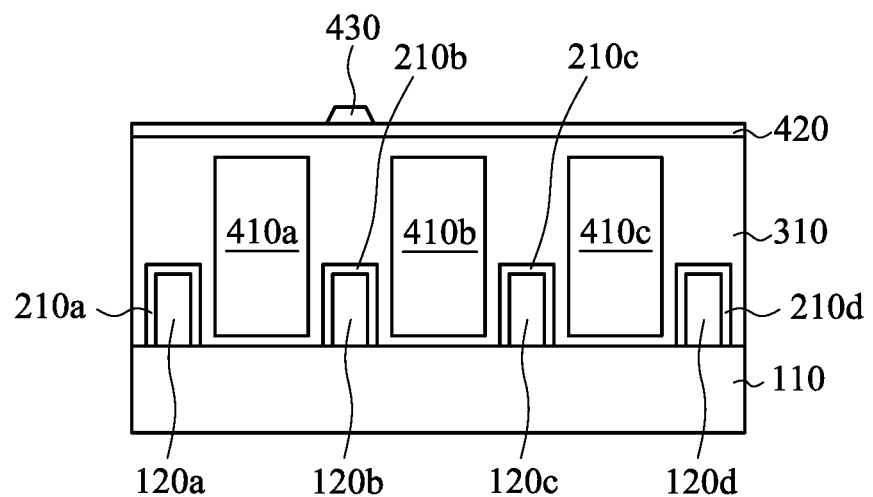

As representatively illustrated in FIG. 4, radiation-detecting regions 410a, 410b, 410c may be formed (FIG. 10, step 1040) by ion implantation in photolayer 310 to produce, e.g., photodiode device elements. The ion implantation process embeds a dopant having an opposite doping polarity as compared with the composition of photolayer 310. For example, in a representative embodiment where photolayer 310 comprises n-type silicon, radiation-detecting regions 410a, 410b, 410c may be doped with a p-type dopant (e.g., boron). In various representative embodiments, radiation-detecting regions 410a, 410b, 410c may comprise photodiodes, photogates, phototransistors, light-sensitive field-effect transistors (photoFETs), photovoltaic cells, and/or the like, or combinations thereof. Accordingly, specific structural details and specifications have been omitted from the Figures in favor of generalized characterization and representative illustration of radiation-detecting regions 410a, 410b, 410c.

In a representative embodiment, radiation-detecting regions 410a, 410b, 410c may comprise photodiodes having depletion zones suitably configured for the detection of incident electromagnetic radiation. When an incident photon is absorbed in the depletion zone of a radiation-detecting region, the photon's energy may be of a sufficient magnitude to promote an electron from a valence band to a conduction band, thereby producing a detectable photocurrent. In the case of a BSI image sensor device, detected photons are incident to the backside of the image sensor device (i.e., the side opposite front-side-lying logic devices).

The vertical displacement of radiation-detecting regions 410a, 410b, 410c in photolayer 310 may be adjusted by tuning the energy level of the implantation process used to form the detection regions. For example, a higher implantation energy produces a deeper implant, which means that radiation-detecting regions 410a, 410b, 410c may be formed more deeply in photolayer 310. Similarly, reduced implantation energy may be used to vertically position radiation-detecting regions 410a, 410b, 410c more shallowly in photolayer 310. Ion implantation processes for producing photodiodes in CMOS image sensors are well known, and further description of the same has been omitted herein for brevity.

FIG. 4 also illustrates deposition of gate oxide layer 420 and formation of transfer gate 430 in accordance with a representative embodiment. Gate oxide layer 420 serves to electrically isolate the gate terminal of transfer gate 430 from underlying photolayer 310. The thickness of gate oxide layer 420 may be suitably configured to prevent tunneling between the gate terminal of transfer gate 430 and underlying photolayer 310. Transfer gate 430 facilitates charge transfer of photocurrent produced in photolayer 310 to, e.g., front-side-lying logic devices (e.g., reset transistors, source followers, row selectors, amplifiers, analog-to-digital converter (ADC) devices, application-specific integrated circuit (ASIC) devices, system-on-chip (SOC) devices, and/or the like, or combinations thereof). Processes for depositing gate oxide material and forming transfer gates are well known, and their further description has been omitted herein for brevity.

Figure 5:
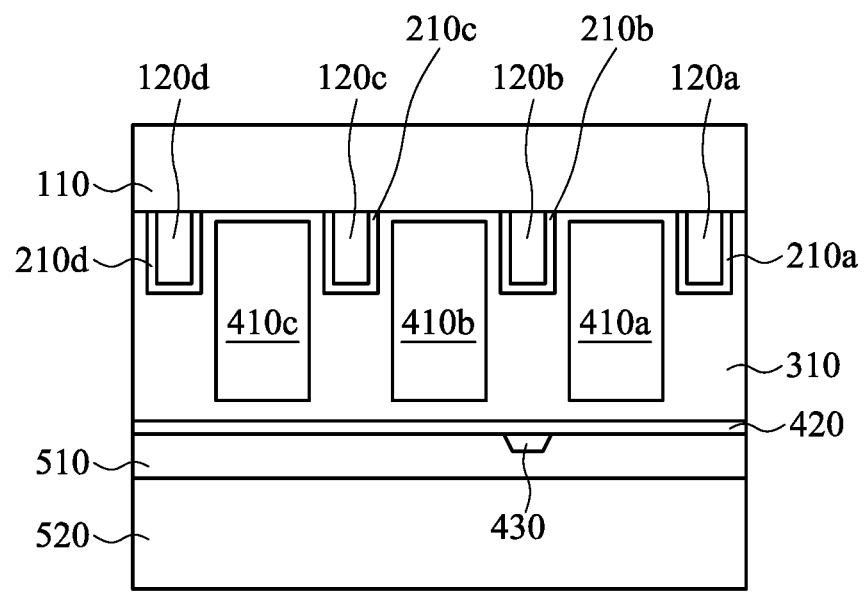

As representatively illustrated in FIG. 5, the sensor wafer assembly shown in FIG. 4 is reversed (flipped over) and bonded to logic device layer 520 through passivation layer 510 disposed therebetween. Passivation layer 510 electrically isolates device elements in logic device layer 520 and device elements in the sensor wafer assembly. Those skilled in the art will appreciated that logic device 520 and/or the sensor wafer assembly may comprise interconnect structures that include a plurality of metallization layers to provide electrical connections between and among various component device elements. FIG. 5 shows a substantially simplified view for the sake of generalized characterization and relevant illustration.

In one embodiment, a first interconnect structure may be formed over the gate oxide layer and the transfer gate of an image sensor to provide electrical connections to a subsequently bonded logic device. The image sensor may have a first passivation layer overlying the first interconnect structure to electrically isolate portions of one or more metallization layers of the first interconnect structure. The logic device may have a second interconnect structure formed over logic circuitry to provide electrical connections to the image sensor after bonding. The logic device may have a second passivation layer overlying the second interconnect structure to electrically isolate portions of one or more metallization layers of the second interconnect structure. The first passivation layer of the image sensor and the second passivation layer of the logic device may include bond pads to provide electrical connections between device elements of the image sensor and device elements of the logic device. After bonding, the logic device and image sensor are electrically coupled to each other and form component parts of a sensor pixel unit.

Those skilled in the art will appreciate that there are a variety of methods and structures that may be alternatively, conjunctively, or sequentially employed to provide electrical connections between a sensor wafer assembly and a logic device layer. Processes for providing interconnect structures, device element passivation, and wafer bonding are known in the art, and further description of the same has been omitted herein for brevity.

Figure 6:
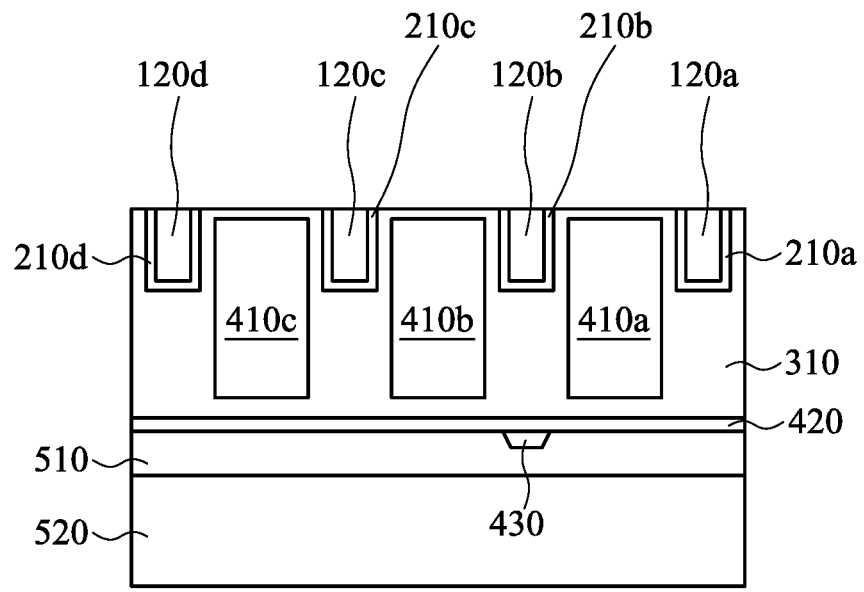

As representatively illustrated in FIG. 6, the bonded wafer assembly shown in FIG. 5 is subjected to a thin-down process to remove (FIG. 10, step 1050) substrate 110 (thus the nomenclature, "sacrificial substrate"). In a representative embodiment, the thin-down process may comprise, e.g., a chemical mechanical planarization (CMP) process. Any suitable removal process, whether now known (e.g., CMP, grinding, etching, polishing, diamond scrubbing, and/or the like, or combinations thereof) or hereafter derived, may be alternatively, conjunctively, or sequentially employed for removal of substrate 110.

In a representative embodiment, the thin-down process may not be concluded until surface portions of dielectric material of pixel isolation structures 120a, 120b, 120c, 120d are physically exposed. Alternatively or conjunctively, the thin-down process may not be concluded until photolayer 310 is exposed. Photolayer 310 may be understood to be optically exposed to the extent that incident electromagnetic radiation is capable of penetrating and being detected by radiation-detecting regions 410a, 410b, 410c.

Thin-down removal of a portion of substrate 110 may provide optical exposure of photolayer 310. Thin-down removal of substrate 100 may provide physical exposure of pixel isolation structures 120a, 120b, 120c, 120d. Optical exposure of photolayer 310 may serve to provide, e.g., a surface of incidence for electromagnetic radiation to enter the image sensor device for subsequent detection in radiation-detecting regions 410a, 410b, 410c. Physical exposure of pixel isolation structures 120a, 120b, 120c, 120d may serve to provide, e.g., electrical and optical separation between adjacent pixel isolation structures. Separation between adjacent pixel isolation structures may be adapted to eliminate or otherwise substantially reduce electrical or optical aberrations relating to image sensor device function or performance.

It will be appreciated that additional processes may be performed to complete fabrication of image sensor devices in accordance with various representative embodiments. For example, an antireflective coating (ARC) layer may be formed over the backside of a BSI image sensor device to reduce reflection of electromagnetic radiation incident to the sensor. Additionally or alternatively, a color filter layer may be formed over the ARC layer to accept or reject electromagnetic radiation of a particular wavelength; which in the case of visible light (i.e., 390 nm to 700 nm), may correspond to a particular color (e.g., red, green, blue, or the like). Accordingly, a suitably configured color filter may be used to accept light of a predetermined color. In the case of wavelengths less than 390 nm or more than 700 nm, a color filter may be understood as providing acceptance or rejection of electromagnetic radiation of particular wavelengths, notwithstanding that such wavelengths do not find correspondence to a "color" in the visible spectrum.

Alternatively, conjunctively, or sequentially, at least a portion of exposed pixel isolation structures 120a, 120b, 120c, 120d may be removed for the formation of a microlens layer to direct incident light away from pixel isolation structures 120a, 120b, 120c, 120d toward radiation-detecting regions 410a, 410b, 410c. Microlenses may be positioned in various arrangements and have various shapes, depending on, e.g., the refractive index of material used to form the microlenses and the distance from the incidence surface of the image sensor and/or underlying radiation-detecting regions.

ARC, color filter, and microlens layers are not shown in the Figures for the sake of generalized characterization and relevant illustration. It will be appreciated, however, that the formation of an ARC layer, a color filter layer, and/or a microlens layer are well known in the art, and further description of the same has been omitted herein for brevity.

Image sensor devices in accordance with various representative embodiments may also include additional components, such as, e.g., charge-coupled devices (CCD) or input/output circuitry to provide an operational environment for, or support external signal communication with, sensor pixels. Such components are also well known in the art, and are not shown in the Figures for the sake of simple and relevant illustration.

Conventional trench isolation structures provide lateral separation distances between implantations of adjacent photodiodes that are typically greater than 100 nm. Conventional trench isolation structures also have sidewall profile features that generally include rounded top corners and rounded bottom corners.

Figure 7:
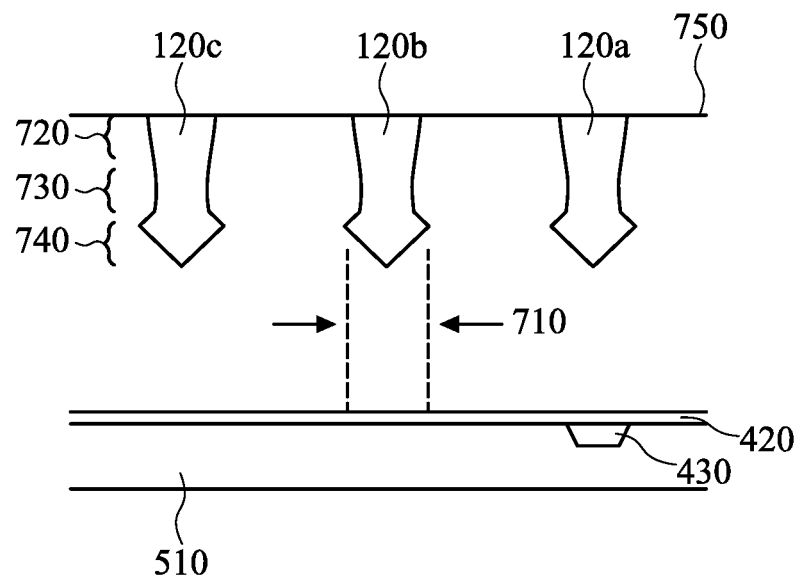
FIG. 7 illustrates, in fragmentary cross-sectional view, pixel isolation device features in accordance with a representative embodiment.

FIG. 7 representatively illustrates pixel isolation features in accordance with various representative embodiments. Pixel isolation structures 120a, 120b, 120c overlie gate oxide layer 420, transfer gate 430, and passivation layer 510 (illustrated in FIG. 7 for vantage reference). In accordance with representative embodiments, the width 710 of representative pixel isolation structures (e.g., 120b) provide narrower separation distances between implantations of adjacent radiation-detecting regions as compared with conventional trench isolation widths. The lateral width 710 for pixel isolation structures, in accordance with various representative embodiments disclosed herein, are typically less than about 100 nm.

Sidewall profile features for pixel isolation structures 120a, 120b, 120c are also shown in FIG. 7, and generally include upper sidewall portion 720 having a substantially vertical profile, middle sidewall portion 730 having a substantially outward-bowing profile, and lower sidewall portion 740 having a substantially under-cut bottom profile. Typically, lower sidewall portion 740 is formed by (111) facet on the bottom side of pixel isolation structures 120a, 120b, 120c.

Upper sidewall portion 720 is substantially vertical owing to the planarization process used to produce post-CMP surface 750 after removal of the sacrificial substrate. The outward-bowing profile of middle sidewall portion 730 and undercut bottom profile of lower sidewall portion 740 are produced from the original etching profile used to pattern the dielectric material to form pixel isolation structures 120a, 120b, 120c.

Figure 8:
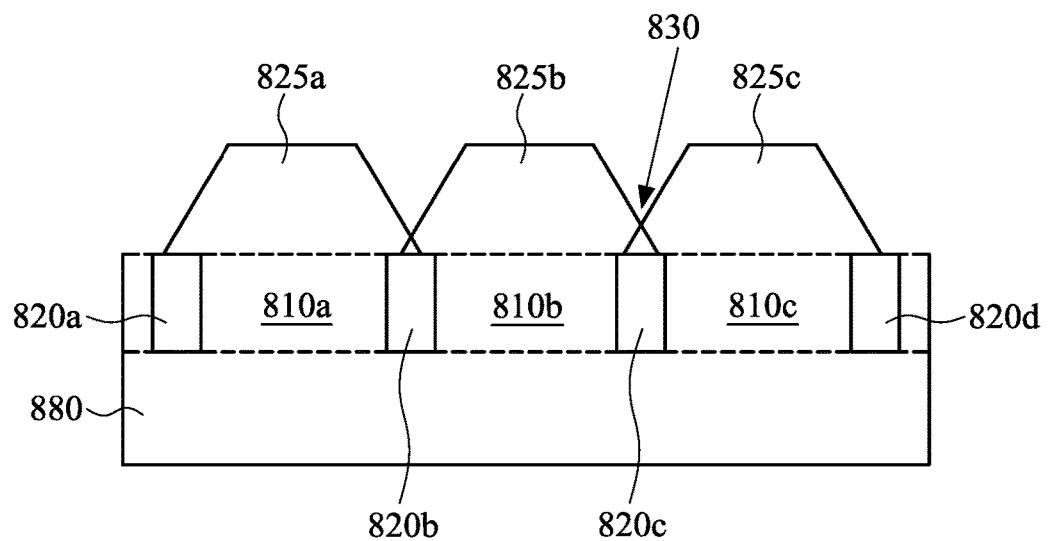
FIGS. 8-9 illustrates, in cross-sectional view, epitaxially deposited photolayers in accordance with representative embodiments.

FIG. 8 illustrates another representative embodiment where photolayer material 810a, 825a, 810b, 825b, 810c, 825c may be epitaxially deposited between and over dielectric pixel isolation structures 820a, 820b, 820c, 820d. Dielectric pixel isolation structures 820a, 820b, 820c, 820d may be formed in a substantially similar process as that of pixel isolation structures 120a, 120b, 120c, 120d. The material of dielectric pixel isolation structures 820a, 820b, 820c, 820d may comprise, e.g., an oxide material, a nitride material, or an oxynitride material. In one embodiment, the material forming dielectric pixel isolation structures 820a, 820b, 820c, 820d may comprise $SiO_2$. In other representative embodiments, material forming dielectric pixel isolation structures 820a, 820b, 820c, 820d may alternatively or conjunctively comprise SiC, SiN, SiOC, SiON, and/or the like, or a combination thereof.

In accordance with various representative embodiments disclosed herein, methods for dielectric pixel isolation structure fabrication generally comprise an anteceding step of depositing a dielectric material and a subsequent step of patterning the deposited dielectric material to form the isolation structures. In various embodiments, dielectric pixel isolation structures 820a, 820b, 820c, 820d may comprise DTI structures having depths ranging from about 1 μm to about 3 μm. In a representative embodiment, dielectric pixel isolation structures 820a, 820b, 820c, 820d may have a depth of about 1 μm.

Epitaxial photolayer material 810a, 825a, 810b, 825b, 810c, 825c may be deposited over dielectric pixel isolation structures 820a, 820b, 820c, 820d with an in situ epitaxial growth process. In one embodiment, epitaxial photolayer material 810a, 825a, 810b, 825b, 810c, 825c may comprise epitaxial silicon or silicon-germanium, e.g., doped with boron, phosphorus, or carbon. In a representative embodiment, epitaxial photolayer material 810a, 825a, 810b, 825b, 810c, 825c may comprise one or more n-type epitaxial silicon or silicon-germanium layers. Epitaxial photolayer material 810a, 825a, 810b, 825b, 810c, 825c may alternatively or conjunctively comprise one or more p-type epitaxial silicon or silicon-germanium layers. In an exemplary embodiment, epitaxial photolayer material 810a, 825a, 810b, 825b, 810c, 825c comprises multiple layers of n-type epitaxial silicon. In a representative implementation, the epitaxial growth process may comprise, e.g., an SEG process. As epitaxial deposition proceeds, land areas 810a, 810b, 810c are seeded from epitaxial growth on the top surface of sacrificial substrate 880 to fill the regions between dielectric pixel isolation structures 820a, 820b, 820c, 820d. Thereafter, the growth front of epitaxial material 825a, 825b, 825c extends above dielectric pixel isolation structures 820a, 820b, 820c, 820d to form a photolayer region for either in situ doping or subsequent implantation of radiation-detecting regions.

As the growth projections of epitaxial material 825a, 825b, 825c grow above the surfaces of dielectric pixel isolation structures 820a, 820b, 820c, 820d, they also grow laterally to cover dielectric pixel isolation structures 820a, 820b, 820c, 820d, as well as growing into each other. As the growth projections of epitaxial material 825a, 825b, 825c grow into each other, dislocation areas are formed (e.g., dislocation area 830 between epitaxial material 825b and 825c). Dislocation area 830 corresponds to a crystallographic defect resulting from intersecting planes of crystal growth of adjacent epitaxial growth projections not having mutually aligned lattice structures. In general, the formation of crystallographic defects directly above the pixel isolation structures does not present a problem to the extent that the radiation-detecting regions in the photolayer therebetween remain substantially defect free. Accordingly, process considerations associated with this embodiment would be expected to present fewer challenges with regard to epitaxial photolayer deposition. Notwithstanding the preceding, a thermal annealing process or a selective etch-back process may be performed to remove dislocations.

In a representative embodiment, an SEG process may be performed to epitaxially deposit photolayer material 810a, 825a, 810b, 825b, 810c, 825c. The SEG process may comprise, e.g., a CVD process, such as LPCVD. In a representative embodiment, LPCVD may be performed at temperatures between about 300° C. to about 1050° C. and pressures between about 1 Torr to about 500 Torr. The LPCVD process may use a silicon-based or germanium-based precursor gas, such as, e.g., silane, dichlorosilane, disilane, trisilane, other silicon-based gases, germane, or other germanium-based precursor gases, or a combination thereof. Other process gases may include, e.g., diborane, molecular hydrogen, molecular chlorine, and/or the like, or combinations thereof.

An etching gas (e.g., $SiH_2Cl_2$, HCl, or the like) may be used to control selective growth between silicon areas and dielectric surfaces. In other embodiments, the deposition and etching processes may be separately performed or otherwise separately controlled. For example, an epitaxial deposition process may be performed for non-selective growth of silicon followed by etching steps to remove deposited silicon from a dielectric surface to maintain selectivity.

The SEG process may be adapted to provide in situ doping concurrent with epitaxial deposition of photolayer material 810a, 825a, 810b, 825b, 810c, 825c. In a representative embodiment, an n-type dopant may be introduced using a phosphorus-containing gas, such as, e.g., phosphine ($PH_3$). Accordingly, the epitaxial layer(s) forming photolayer material 810a, 825a, 810b, 825b, 810c, 825c may comprise silicon doped with phosphorus (Si:P). In one embodiment, the silicon-based precursor gas may be introduced into a chamber at a flow rate of about 50 sccm to about 500 sccm, and phosphine (e.g., 1 atom %) may be introduced into the chamber at a flow rate of about 0.01 sccm to about 100 sccm. The deposition time of SEG Si:P may be from about 60 seconds to about 1200 seconds. If epitaxially formed photolayer material 810a, 825a, 810b, 825b, 810c, 825c is not doped during SEG processing, it may be doped in a subsequent process that uses, e.g., ion implantation, PIII, gas/solid source diffusion, or other process, or a combination thereof. An annealing process (e.g., rapid thermal or laser thermal anneal) may be performed to activate dopants in photolayer material 810a, 825a, 810b, 825b, 810c, 825c. SEG processes are known in the art and it will be appreciated that various parameters may be modified or otherwise tuned to epitaxially form photolayer material 810a, 825a, 810b, 825b, 810c, 825c (e.g., temperature, pressure, deposition time, and/or the like).

In various representative embodiments, the material used for epitaxial deposition may be selected for compatibility with subsequent implantation of a depletion zone suitably configured for the detection of electromagnetic radiation of a given wavelength. Radiation-detecting regions may be formed by ion implantation in the photolayer to produce, e.g., photodiode device elements.

Figure 9:
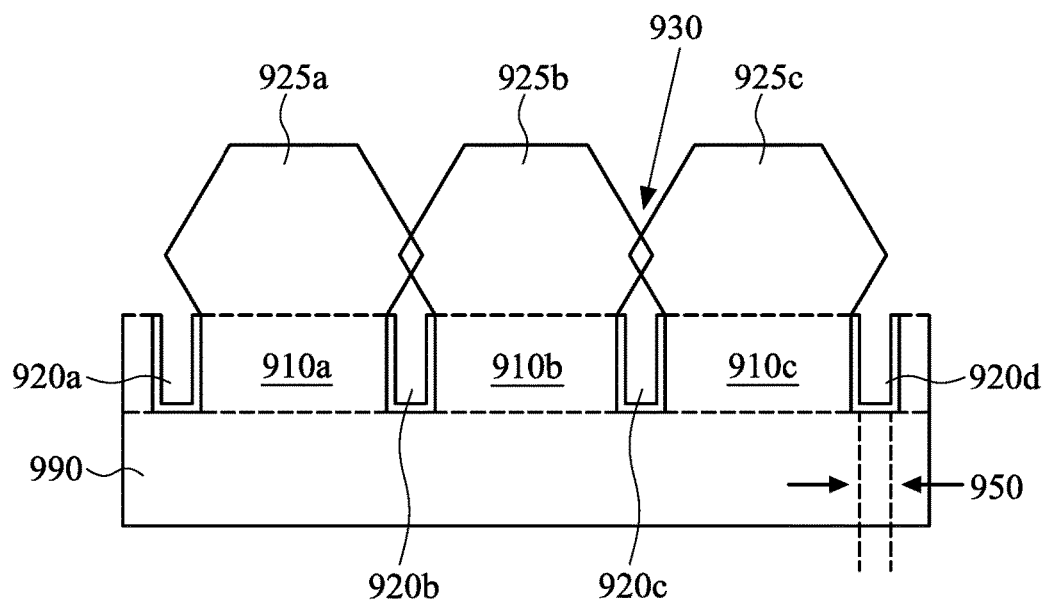

FIG. 9 illustrates another representative embodiment where photolayer material 910a, 925a, 910b, 925b, 910c, 925c may be epitaxially deposited between and over dielectric pixel isolation structures 920a, 920b, 920c, 920d. Dielectric pixel isolation structures 920a, 920b, 920c, 920d comprise dielectric lined cavities. The liner material of dielectric pixel isolation structures 920a, 920b, 920c, 920d may comprise, e.g., an oxide material, a nitride material, or an oxynitride material. In one embodiment, the liner material forming dielectric pixel isolation structures 920a, 920b, 920c, 920d may comprise $SiO_2$. In other representative embodiments, liner material forming dielectric pixel isolation structures 920a, 920b, 920c, 920d may alternatively or conjunctively comprise SiC, SiN, SiOC, SiON, and/or the like, or a combination thereof.

In accordance with various representative embodiments disclosed herein, methods for dielectric pixel isolation structure fabrication generally comprise an anteceding step of depositing a dielectric material and a subsequent step of patterning the deposited dielectric material to form the dielectric lined cavity isolation structures. In various embodiments, dielectric pixel isolation structures 920a, 920b, 920c, 920d may comprise DTI structures having depths ranging from about 1 μm to about 3 μm. In a representative embodiment, dielectric pixel isolation structures 920a, 920b, 920c, 920d may have a depth of about 1 µm.

Epitaxial photolayer material 910a, 925a, 910b, 925b, 910c, 925c may be deposited over dielectric pixel isolation structures 920a, 920b, 920c, 920d with an in situ epitaxial growth process. In one embodiment, epitaxial photolayer material 910a, 925a, 910b, 925b, 910c, 925c may comprise epitaxial silicon or silicon-germanium, e.g., doped with boron, phosphorus, or carbon. In a representative embodiment, epitaxial photolayer material 910a, 925a, 910b, 925b, 910c, 925c may comprise one or more n-type epitaxial silicon or silicon-germanium layers. Epitaxial photolayer material 910a, 925a, 910b, 925b, 910c, 925c may alternatively or conjunctively comprise one or more p-type epitaxial silicon or silicon-germanium layers. In an exemplary embodiment, epitaxial photolayer material 910a, 925a, 910b, 925b, 910c, 925c comprises multiple layers of n-type epitaxial silicon. In a representative implementation, the epitaxial growth process may comprise, e.g., an SEG process. As epitaxial deposition proceeds, land areas 910a, 910b, 910c are seeded from epitaxial growth on the top surface of sacrificial substrate 990 to fill the regions between dielectric pixel isolation structures 920a, 920b, 920c, 920d. Thereafter, the growth front of epitaxial material 925a, 925b, 925c extends above dielectric pixel isolation structures 920a, 920b, 920c, 920d to form a photolayer region for either in situ doping or subsequent implantation of radiation-detecting regions.

As the growth projections of epitaxial material 925a, 925b, 925c grow above the surfaces of dielectric pixel isolation structures 920a, 920b, 920c, 920d, they also grow laterally to cover dielectric pixel isolation structures 920a, 920b, 920c, 920d to produce embedded voids within pixel isolation structures 920a, 920b, 920c, 920d. As the growth projections of epitaxial material 925a, 925b, 925c grow above the surfaces of dielectric pixel isolation structures 920a, 920b, 920c, 920d, they also grown into each other. As the growth projections of epitaxial material 925a, 925b, 925c grow into each other, dislocation areas are formed (e.g., dislocation area 930 between epitaxial material 925b and 925c). Dislocation area 930 corresponds to a crystallographic defect resulting from intersecting planes of crystal growth of adjacent epitaxial growth projections not having mutually aligned lattice structures. In general, the formation of crystallographic defects directly above the pixel isolation structures does not present a problem to the extent that the radiation-detecting regions in the photolayer therebetween remain substantially defect free. Accordingly, process considerations associated with this embodiment would be expected to present fewer challenges with regard to epitaxial photolayer deposition. Notwithstanding the preceding, a thermal annealing process or a selective etch-back process may be performed to remove dislocation areas.

In a representative embodiment, an SEG process may be performed to epitaxially deposit photolayer material 910a, 925a, 910b, 925b, 910c, 925c. The SEG process may comprise, e.g., a CVD process, such as LPCVD. In a representative embodiment, LPCVD may be performed at temperatures between about 300° C. to about 1050° C. and pressures between about 1 Torr to about 500 Torr. The LPCVD process may use a silicon-based or germanium-based precursor gas, such as, e.g., silane, dichlorosilane, disilane, trisilane, other silicon-based gases, germane, or other germanium-based precursor gases, or a combination thereof. Other process gases may include, e.g., diborane, molecular hydrogen, molecular chlorine, and/or the like, or combinations thereof.

An etching gas (e.g., $SiH_2Cl_2$, HCl, or the like) may be used to control selective growth between silicon areas and dielectric surfaces. In other embodiments, the deposition and etching processes may be separately performed or otherwise separately controlled. For example, an epitaxial deposition process may be performed for non-selective growth of silicon followed by etching steps to remove deposited silicon from a dielectric surface to maintain selectivity.

The SEG process may be adapted to provide in situ doping concurrent with epitaxial deposition of photolayer material 910a, 925a, 910b, 925b, 910c, 925c. In a representative embodiment, an n-type dopant may be introduced using a phosphorus-containing gas, such as, e.g., phosphine ($PH_3$). Accordingly, the epitaxial layer(s) forming photolayer material 910a, 925a, 910b, 925b, 910c, 925c may comprise silicon doped with phosphorus (Si:P). In one embodiment, the silicon-based precursor gas may be introduced into a chamber at a flow rate of about 50 sccm to about 500 sccm, and phosphine (e.g., 1 atom %) may be introduced into the chamber at a flow rate of about 0.01 sccm to about 100 sccm. The deposition time of SEG Si:P may be from about 60 seconds to about 1200 seconds. If epitaxially formed photolayer material 910a, 925a, 910b, 925b, 910c, 925c is not doped during SEG processing, it may be doped in a subsequent process that uses, e.g., ion implantation, PIII, gas/solid source diffusion, or other process, or a combination thereof. An annealing process (e.g., rapid thermal or laser thermal anneal) may be performed to activate dopants in photolayer material 910a, 925a, 910b, 925b, 910c, 925c. SEG processes are known in the art and it will be appreciated that various parameters may be modified or otherwise tuned to epitaxially form photolayer material 910a, 925a, 910b, 925b, 910c, 925c (e.g., temperature, pressure, deposition time, and/or the like).

In various representative embodiments, the material used for epitaxial deposition may be selected for compatibility with subsequent implantation of a depletion zone suitably configured for the detection of electromagnetic radiation of a given wavelength. Radiation-detecting regions may be formed by ion implantation in the photolayer to produce, e.g., photodiode device elements.

Various disclosed embodiment provide image sensor devices having pixel isolation structures formed on a sacrificial substrate. The pixel isolation structures comprise a dielectric material that is deposited and subsequently patterned on the sacrificial substrate. The image sensor device has a photolayer epitaxially deposited over the pixel isolation structures and radiation-detecting regions formed in the photolayer adjacent to the pixel isolation structures. The epitaxial photolayer may comprise silicon doped with at least one of boron, phosphorus, or carbon. The radiation-detecting regions are suitably configured to detect electromagnetic radiation incident to the photolayer. A backside of the image sensor device is formed by planarized removal of the sacrificial substrate to physically expose the pixel isolation structures and optically expose the photolayer. The photolayer may comprise at least one layer of epitaxial n-type silicon. The pixel isolation structures may each have lateral widths of less than about 100 nm. The image sensor device may also comprise a gate oxide layer and transfer gates formed over the photolayer prior to removal of the sacrificial substrate. The image sensor may also comprise bonded logic devices having interconnect structures comprising one or more metallization layers for providing electrical connections between and among component device elements. The image sensor device may also include one or more passivation layers for isolating various component device elements. The dielectric material of the pixel isolation structures may comprise at least one of SiC, SiN, SiOC, SiON, or $SiO_2$. The pixel isolation structures may comprise deep trench isolation (DTI) structures having depths of about 1 μm. The pixel isolation structures may also comprise a doped layer on and around the pixel isolation structures. The doped layer may blanket, cover, and surround the dielectric material of the pixel isolation structures. The doped layer may comprise boron-doped polysilicon. The epitaxial photolayer may comprise silicon or silicon-germanium doped with at least one of boron, phosphorus, or carbon. The pixel isolation structures may have substantially vertical upper sidewall profiles proximately located to the backside illumination surface of the image sensor device, substantially under-cut bottom lower sidewall profiles, and/or substantially outward-bowing sidewall profiles for a middle sidewall portion disposed between the upper and lower sidewall portions.

Another representative embodiment provides a method for fabricating an image sensor pixel that comprises the steps of: providing a sacrificial substrate having a first side and a second side, depositing a dielectric material on the first side of the sacrificial substrate and subsequently patterning the dielectric material to form a pixel isolation structure on the first side of the sacrificial substrate, depositing a dopant layer over the dielectric material, thermally diffusing a dopant of the dopant layer into the dielectric material, depositing at least one epitaxial layer over the pixel isolation structure, implanting a radiation-detecting region adjacent to the pixel isolation structure within the photolayer, and planarizing the second side of the sacrificial substrate to remove the sacrificial substrate, thereby physically exposing the pixel isolation structure and optically exposing the photolayer. The method may further comprise the steps of performing a first epitaxial growth process to form a first epitaxial layer over the pixel isolation structure, wherein a dislocation area forms in the first epitaxial layer during the first epitaxial growth process, and performing a process to remove the dislocation area. The method may additionally comprise the step of performing a second epitaxial growth process to form a second epitaxial layer over the first epitaxial layer. The epitaxial growth process may be used to produce at least one epitaxial layer having a thickness of about 2.5 μm to about 3 μm. The method may also comprise the steps of removing at least a portion of the exposed pixel isolation structure and filling at least a portion of a region previously occupied by the removed portion of the exposed pixel isolation structure with a material (e.g., a microlens layer) such that light incident on the image sensor device is directed away from the pixel isolation structure towards the radiation-detecting region.

Another embodiment provides a method for fabricating an image sensor pixel that comprises the steps of: forming a recess in a first side of a substrate, at least partially filling the recess with a dielectric material to form a pixel isolation structure, epitaxially depositing a photolayer over the substrate and pixel isolation structure, forming a radiation-detecting region in the photolayer adjacent to the pixel isolation structure, and removing at least a portion of a second side of the substrate to physically expose the pixel isolation structure and optically expose the photolayer. The recess may be substantially completely filled or at least partially filled to form the pixel isolation structure. In a representative embodiment where the recess is partially filled, the sidewalls and/or bottom of the recess may be lined with a dielectric material with a void between the lined sidewall portions. Epitaxial deposition of photolayer material over the void and lined sidewall portions produces an embedded void (e.g., an air gap or keyhole) pixel isolation structure.

Benefits may be realized in accordance with various representative embodiments. It will be understood, however, that different embodiments may offer different advantages and that no particular advantage is required to be demonstrated by all embodiments.

For example, one benefit is the reduction of crosstalk (XT), or other electrical/optical aberration, in a BSI image sensor device. Representatively disclosed embodiments provide backside deep trench isolation (BSDTI) features that electrically and optically isolate adjacent pixels. The relatively long depth of the BSDTI can substantially reduce XT between adjacent pixels. Other representative embodiments provide a boron-passivation layer over the pixel isolation structures. The boron-passivation layer serves to further reduce XT, or other electrical/optical aberration.

Another benefit of representatively disclosed embodiments provides less complex processing techniques for producing trench-like isolation structures, as compared with conventional approaches that employ, e.g., backside etching, high-K passivation, and trench gap-fill with etching, sputtering, and CVD. Another benefit of representatively disclosed embodiments eliminates or otherwise mitigates feature damage associated with conventional etching processes used to form recessed trenches, thereby substantially reducing dark current.

Another benefit of representatively disclosed embodiments is that allocated thermal budgets for temperature-dependent processes may be substantially extended. Conventional approaches generally have a thermal budget of about 400° C. Consequently, conventional thermal budgets do not allow for annealed damage recovery above 400° C. In various representative embodiments, allocated thermal budgets may be extended to 900° C. or more.

Yet another benefit of representatively disclosed embodiments relates to sidewall profiles of the pixel isolation structures. In accordance with various representative embodiments, unique sidewall profiles may be obtained that exhibit distinctive shapes, higher aspect ratios, and sharper component feature definition as compared with conventional art. Representatively disclosed embodiments provide lateral separation widths between adjacent radiation-detecting regions of less than about 100 nm. This allows for substantial reduction in sensor device size and/or greater sensor pixel density.

Still another benefit of representatively disclosed embodiments involves the ease with which a radiation-detecting region in a photolayer may be formed with in situ doping of epitaxially grown silicon or silicon-germanium.

Benefits, other advantages, and solutions to problems have been described with regard to specific embodiments; however, benefits, advantages, solutions to problems, and any component(s) that may cause any benefit, advantage, or solution to occur or become more pronounced are not to be construed as a critical, required, or essential feature or component.

As used herein, the terms "comprises," "comprising," "includes," "including," "has," "having," or any contextual variant thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Furthermore, unless expressly stated to the contrary, "or" refers to an inclusive or and not an exclusive or. That is, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless the context clearly indicates otherwise. Also, as used in the description herein, the meaning of "in" includes "in" and "on," unless the context clearly indicates otherwise.

As used herein, the term "in situ" generally indicates that a process may be performed substantially, but at least partly, "in place" and/or "at the same time." As used herein, the term "exposed surface," with no other designation, generally refers to a physically exposed surface or an optically exposed surface.

Examples or illustrations provided herein are not to be regarded in any way as restrictions on, limits to, or express definitions of any term or terms with which they are associated. Instead, these examples or illustrations are to be regarded as being described with respect to one particular embodiment and as merely illustrative. Those skilled in the art will appreciate that any term or terms with which these examples or illustrations are associated will encompass other embodiments that may or may not be given therewith or elsewhere in the specification, and all such embodiments are intended to be included within the scope of that term or terms. Language designating such non-limiting examples and illustrations includes, but is not limited to: "for example," "for instance," "e.g.," "in a representative embodiment," or "in one embodiment." Reference throughout this specification to "one embodiment," "an embodiment," "a representative embodiment," "a particular embodiment," or "a specific embodiment," or contextually similar terminology, means that a particular feature, structure, property, or characteristic described in connection with the embodiment is included in at least one embodiment and may not necessarily be present in all embodiments. Thus, respective appearances of the phrases "in one embodiment," "in an embodiment," or "in a specific embodiment," or similar terminology in various places throughout this specification are not necessarily referring to the same embodiment. Furthermore, particular features, structures, properties, or characteristics of any specific embodiment may be combined in any suitable manner with one or more other embodiments.

Although steps, operations, or procedures are presented in a specific order, this order may be changed in different embodiments. In some embodiments, to the extent multiple steps are shown as sequential in the specification or claims, some combination of such steps in alternative embodiments may be performed at the same time or in a different order. The sequence of operations described herein may be interrupted, suspended, or otherwise controlled by another process.

Although representative embodiments and their advantages have been described in detail, it should be understood that various changes, substitutions, and alterations may be made herein without departing from the spirit and scope of the disclosure as included by the appended claims. Moreover, the scope of the present disclosure is not intended to be limited to the particular embodiments of any process, product, machine, manufacture, assembly, apparatus, composition of matter, means, methods, or steps described in the specification. As one skilled in the art will readily appreciate from the disclosure, various processes, products, machines, manufacture, assemblies, apparatuses, compositions of matter, means, methods, or steps, whether presently existing or later developed, that perform substantially the same function or achieve substantially the same result as the corresponding representative embodiments described herein may be utilized according to the disclosure herein. The appended claims are intended to include within their scope such processes, products, machines, manufacture, assemblies, apparatuses, compositions of matter, means, methods, or steps.

What is claimed is:

1. An image sensor device, comprising:
    a pixel isolation structure having a first interiorly-disposed region and an exteriorly-disposed region, the first interiorly-disposed region comprising a dielectric material, the exteriorly-disposed region comprising a doped material, wherein the pixel isolation structure comprises:
        an upper sidewall portion having a substantially vertical profile, the upper sidewall portion proximate a backside surface of the pixel isolation structure;
        a lower sidewall portion having a substantially undercut bottom profile formed on a (111) facet; and
        a middle sidewall portion between the upper sidewall portion and the lower sidewall portion, the middle sidewall portion having a substantially bowed profile; and
    a photolayer adjacent to the pixel isolation structure, the photolayer having a second interiorly-disposed region comprising a radiation-detecting region.

2. The image sensor device of claim 1, wherein:
    the photolayer comprises an epitaxial layer; and
    the radiation-detecting region comprises a photodiode.

3. The image sensor device of claim 2, wherein the epitaxial layer comprises epitaxial n-type silicon.

4. The image sensor device of claim 1, wherein the doped material comprises boron-doped polysilicon.

5. The image sensor device of claim 1, further comprising:
    a gate oxide layer and a transfer gate over the photolayer;
    a first interconnect structure over the gate oxide layer and the transfer gate;
    a first passivation layer over the first interconnect structure; and
    a logic device over the first passivation layer.

6. The image sensor device of claim 5, wherein:
    the logic device comprises an application-specific integrated circuit (ASIC) having a second interconnect structure and a second passivation layer over the second interconnect structure;
    the first interconnect structure comprising one or more first metallization layers;
    the second interconnect structure comprising one or more second metallization layers; and
    the second passivation layer is bonded to the first passivation layer.

7. The image sensor device of claim 1, wherein the pixel isolation structure comprises a cavity.

8. An image sensor device, comprising:
    a first pixel isolation structure and a second pixel isolation structure; and
    a photolayer extending between and below the first pixel isolation structure and the second pixel isolation structure, the photolayer comprising an epitaxial crystalline structure, an interface between the epitaxial crystalline structure and a corner region of the first pixel isolation structure being along a (111) facet surface of the epitaxial crystalline structure, wherein a surface of the first pixel isolation structure, a surface of the second pixel isolation structure, and a first surface of the epitaxial crystalline structure are level with each other, wherein a width of the first pixel isolation structure increases as the first pixel isolation structure extends away from the surface of the first pixel isolation structure.

9. The image sensor device of claim 8, wherein the first pixel isolation structure and the second pixel isolation structure comprise a cavity.

10. The image sensor device of claim 8, wherein a depth of the first pixel isolation structure is from about 1 µm to about 3 µm.

11. The image sensor device of claim 8, wherein the first pixel isolation structure comprises p-type dopants.

12. The image sensor device of claim 11, wherein the first pixel isolation structure has a uniform doping profile.

13. The image sensor device of claim 12, further comprising a transfer gate on a second surface of the epitaxial crystalline structure, the second surface and the first surface being opposing surfaces.

14. The image sensor device of claim 13, further comprising:
a passivation layer over the transfer gate; and
a logic chip bonded to the passivation layer, wherein the passivation layer is interposed between the transfer gate and the logic chip.

15. An image sensor device comprising:
an epitaxial layer having a first radiation-detecting region and a second radiation-detecting region; and
a pixel isolation structure interposed between the first radiation-detecting region and the second radiation-detecting region, wherein a first surface of the first radiation-detecting region, a first surface of the second radiation-detecting region, and a first surface of the pixel isolation structure are level, wherein the epitaxial layer extends from the first radiation-detecting region to the second radiation-detecting region along a second surface of the pixel isolation structure, wherein a width of the pixel isolation structure is narrower along the first surface of the pixel isolation structure than a region nearer the second surface of the pixel isolation structure.

16. The image sensor device of claim 15, wherein an interface along a corner of the pixel isolation structure is along a (111) facet surface of the epitaxial layer.

17. The image sensor device of claim 15, wherein an area of the epitaxial layer along the second surface of the pixel isolation structure is free of dislocations.

18. The image sensor device of claim 15, further comprising:
a transfer gate over the second surface of the epitaxial layer;
a passivation layer over the transfer gate; and
a logic chip bonded to the passivation layer.

19. The image sensor device of claim 15, wherein the pixel isolation structure comprises a cavity.

20. The image sensor device of claim 15, wherein the pixel isolation structure comprises a uniform boron doped region.

* * * * *